United States Patent
Lee

(10) Patent No.: US 6,952,374 B2
(45) Date of Patent: Oct. 4, 2005

(54) MEMORY DEVICE FOR RAPID DATA ACCESS FROM MEMORY CELL

(75) Inventor: Ihl-Ho Lee, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 106 days.

(21) Appl. No.: 10/699,161

(22) Filed: Oct. 31, 2003

(65) Prior Publication Data

US 2004/0240293 A1 Dec. 2, 2004

(30) Foreign Application Priority Data

May 29, 2003 (KR) ........................................ 2003-34306

(51) Int. Cl.[7] ................................................ G11C 7/02
(52) U.S. Cl. .................................. 365/207; 365/230.03
(58) Field of Search ........................... 365/207, 230.03; 257/202

(56) References Cited

U.S. PATENT DOCUMENTS 5,325,336 A 6/1994 Tomishima et al.

6,870,205 B2 * 3/2005 Lee et al. .................. 257/202

FOREIGN PATENT DOCUMENTS

JP 2001-101866 4/2001

* cited by examiner

Primary Examiner—M. Tran
(74) Attorney, Agent, or Firm—Blakely, Sokoloff, Taylor & Zafman

(57) ABSTRACT

A semiconductor memory device having sense amplifier array blocks between neighboring unit memory cell array blocks in a column direction, the semiconductor memory device includes a first sense amplifier driving line configured by passing the sense amplifiers in a row direction, a second sense amplifier driving line configured by passing the sense amplifiers in a row direction, a plurality of first NMOS transistors, which is disposed in the sense amplifier array block, for locally performing a pull-up operation of the first sense amplifier driving line in response to a first control signal, and a second NMOS transistor, which is disposed in a hole area, for performing a pull-down operation of the second sense amplifier driving line in response to a second control signal.

12 Claims, 8 Drawing Sheets

MEMORY DEVICE FOR RAPID DATA ACCESS FROM MEMORY CELL

FIELD OF THE INVENTION

The present invention relates to a semiconductor memory device; and, more particularly, to a semiconductor memory device capable of reducing a data access time of a memory cell.

DESCRIPTION OF RELATED ART

As well-known, after data of a memory cell is provided in the bit lines by activating a word line in order to access the data of the memory cell, there is needed a process to amplify a voltage level of the bit lines by driving a bit line sense amplifier.

The process for amplifying the voltage level of a pair of bit lines BL and /BL can be more quickly carried out by improving a drivability of the sense amplifier. As the voltage level of the pair of bit lines BL and /BL is quickly amplified, a data access time of the memory cell can be decreased.

Sense amplifier drivers for driving the sense amplifiers, which is disclosed in U.S. Pat. No. 5,293,559, issued on Mar. 8, 1994, entitled "SEMICONDUCTOR MEMORY DEVICE HAVING NETLIKE POWER SUPPLY LINES," invented by Kim et al. (hereinafter, referred to as Kim), are disposed not in a memory cell array area but in a peripheral area. Since the sense amplifier drivers consisting of a pull-up driver and a pull-down driver are disposed in the peripheral area, there is a problem that power supply lines for supplying a power supply voltage or a ground voltage to the sense amplifiers have a considerable amount of resistance in the memory cell array area.

In order to solve the above problem, Kim discloses that a plurality of pull-down drivers are disposed in each sense amplifier within the memory cell array area, respectively. However, there is limitation to reduce the resistance of the power supply lines because the power supply lines are connected to each driver in a single path. Also, Kim disclose an arrangement of the sense amplifier driver disposed in a hole area. The hole area represents a space of a rectangle shape between the sense amplifier array blocks and between sub word line drivers. Since the sense amplifier drivers are disposed in the hole area, an area occupied sense amplifier drivers may be decreased and the resistance of the power supply line between the sense amplifier driver and the sense amplifier may be reduced. However, since the number of sense amplifier drivers to be disposed in the hole area is fixed, there is limitation to reduce the whole resistance of the power supply line.

Furthermore, the sense amplifier drivers disclosed in U.S. Pat. No. 5,325,336 issued on Jun. 28, 1994, entitled "SEMICONDUCTOR MEMORY DEVICE HAVING POWER LINE ARRANGED IN MESHED SHAPE," invented by Tomishima et al. (hereinafter, referred to as Tomishima), consists of a single pull-up driver and two pull-down drivers, which are disposed in the hole area. Since a pull-down operation is carried out with two steps, the voltage level of the pair of bit lines BL and /BL may be rapidly amplified. However, there is a problem that the power supply lines between the sense amplifier driver and the sense amplifiers still has a considerable resistance. For solving the above problem, Tomishima discloses an arrangement that a plurality of pull-down drivers and a plurality of pull-up drivers are disposed at each sense amplifier, respectively. In this case, even if the resistance of the power supply lines may be reduced, there is a burden that an area occupied by the sense amplifier drivers is increased.

SUMMARY OF THE INVENTION

It is, therefore, an object of the present invention to provide a semiconductor memory device capable of reducing a data access time of a memory cell.

In accordance with an aspect of the present invention, there is provided a semiconductor memory device having sense amplifier array blocks between neighboring unit memory cell array blocks in a column direction, the semiconductor memory device comprising: a first sense amplifier driving line configured by passing the sense amplifiers in a row direction; a second sense amplifier driving line configured by passing the sense amplifiers in a row direction; a plurality of first NMOS transistors, which is disposed in the sense amplifier array block, for locally performing a pull-up operation of the first sense amplifier driving line in response to a first control signal; and a second NMOS transistor, which is disposed in a hole area, for performing a pull-down operation of the second sense amplifier driving line in response to a second control signal.

In accordance with another aspect of the present invention, there is provided a semiconductor memory device having sense amplifier array blocks between neighboring unit memory call array blocks in a column direction, the semiconductor memory device comprising: a first sense amplifier driving line configured by passing the sense amplifiers in a row direction; a second sense amplifier driving line configured by passing the sense amplifiers in a row direction; a plurality of first NMOS transistors, which is disposed in the sense amplifier array block, for locally performing a pull-up operation of the first sense amplifier driving line in response to a first control signal; and a plurality of second NMOS transistors, which is disposed in the sense amplifier array block, for locally performing a pull-down operation of the second sense amplifier driving line in response to a second control signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, a memory device capable of reducing a data access time of a memory cell according to the present invention will be described in detail referring to the accompanying drawings.

Figure 1:
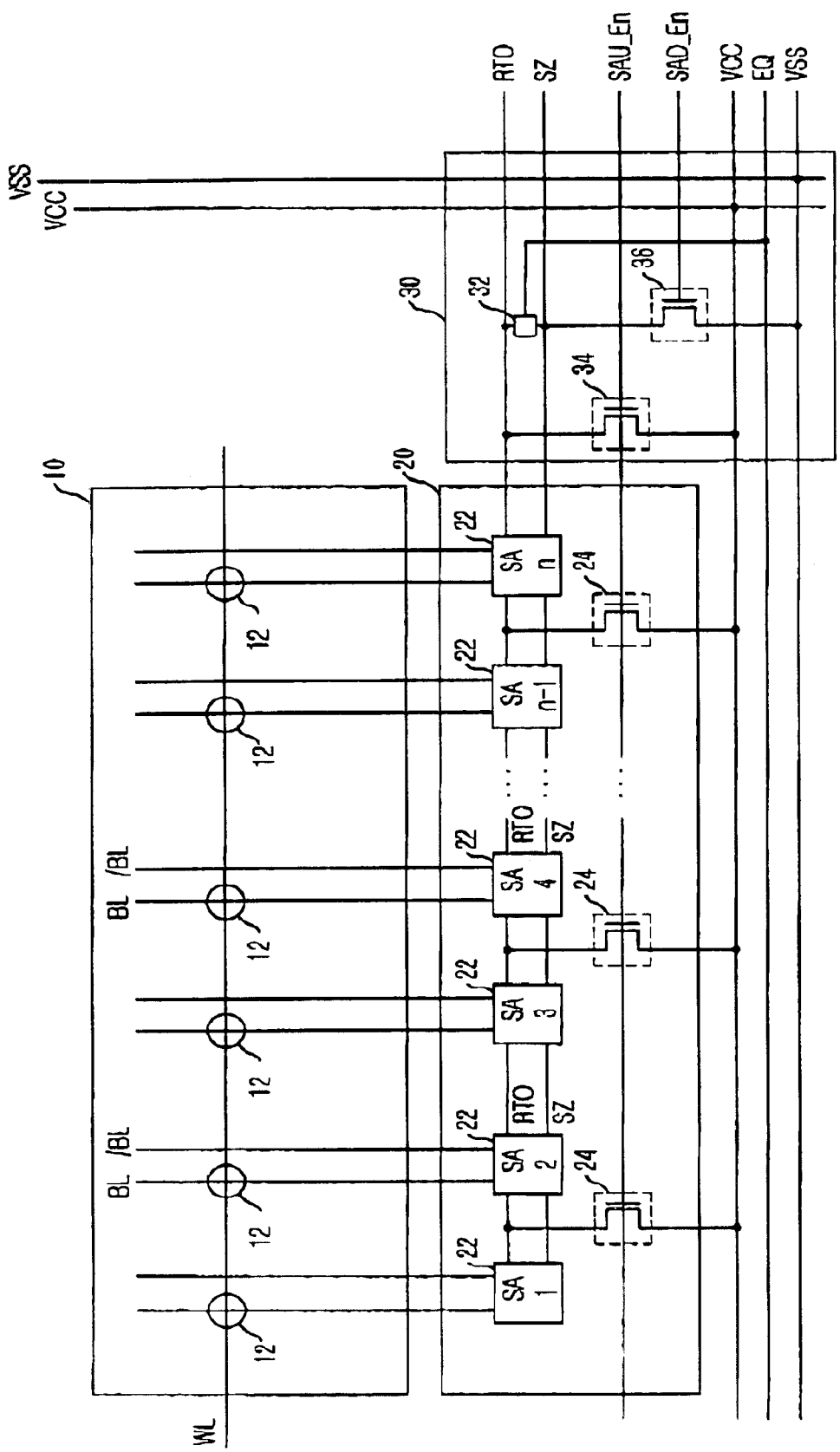
FIG. 1 is a circuit diagram illustrating a memory device in accordance with the preferred embodiment of the present invention.

FIG. 1 is a circuit diagram illustrating a memory device in accordance with the preferred embodiment of the present invention.

As shown, the memory device is divided into a memory cell array block 10, a sense amplifier array block 20 and a hole area 30. The memory cell array block 10 includes a plurality of unit memory cells 12 activated by a row address signal and each unit memory cell 12 has a pair of bit lines BL and /BL. The sense amplifier array block 20 includes a plurality of sense amplifiers 22 for amplifying a voltage level of the bit line when data of the memory cell is provided to the bit line, sense amplifier driving lines RTO and SZ, and a plurality of NMOS transistors 24 for performing a pull-up operation of the sense amplifier driving line RTO. One NMOS transistor 24 is disposed for a set of two sense amplifiers 22. The sense amplifier driving line RTO is a source to drive a PMOS latch of the sense amplifier and the sense amplifier driving line SZ is a source to drive an NMOS latch of the sense amplifier.

An equalizer 32, a first NMOS transistor 34 and a second NMOS transistor 36 are disposed in the hole area 30. The equalizer 32 maintains the sense amplifier driving lines RTO and SZ with a precharge voltage level before the sense amplifier 22 is driven. The first NMOS transistor 34 is to perform a pull-up operation of the sense amplifier driving line RTO and the second NMOS transistor 36 is to perform a pull-down operation of the sense amplifier driving line SZ. Also, power supply lines for supplying a power supply voltage Vcc and a ground voltage Vss are disposed in the hole area 30. A sense amplifier pull-up enable signal SAU_En is applied to gates of the NMOS transistors 24 and 34, and a sense amplifier pull-down enable signal SAP_En is applied to a gate of the second NMOS transistor 36. Herein, since the first NMOS transistor 34 is designed to have much smaller size than that of the NMOS transistor 24 in accordance with the present invention, an operation speed variation of the sense amplifier due to the first NMOS transistors 34 is very week. Therefore, formation of the first NMOS transistor 34 may be omitted.

Figure 2:
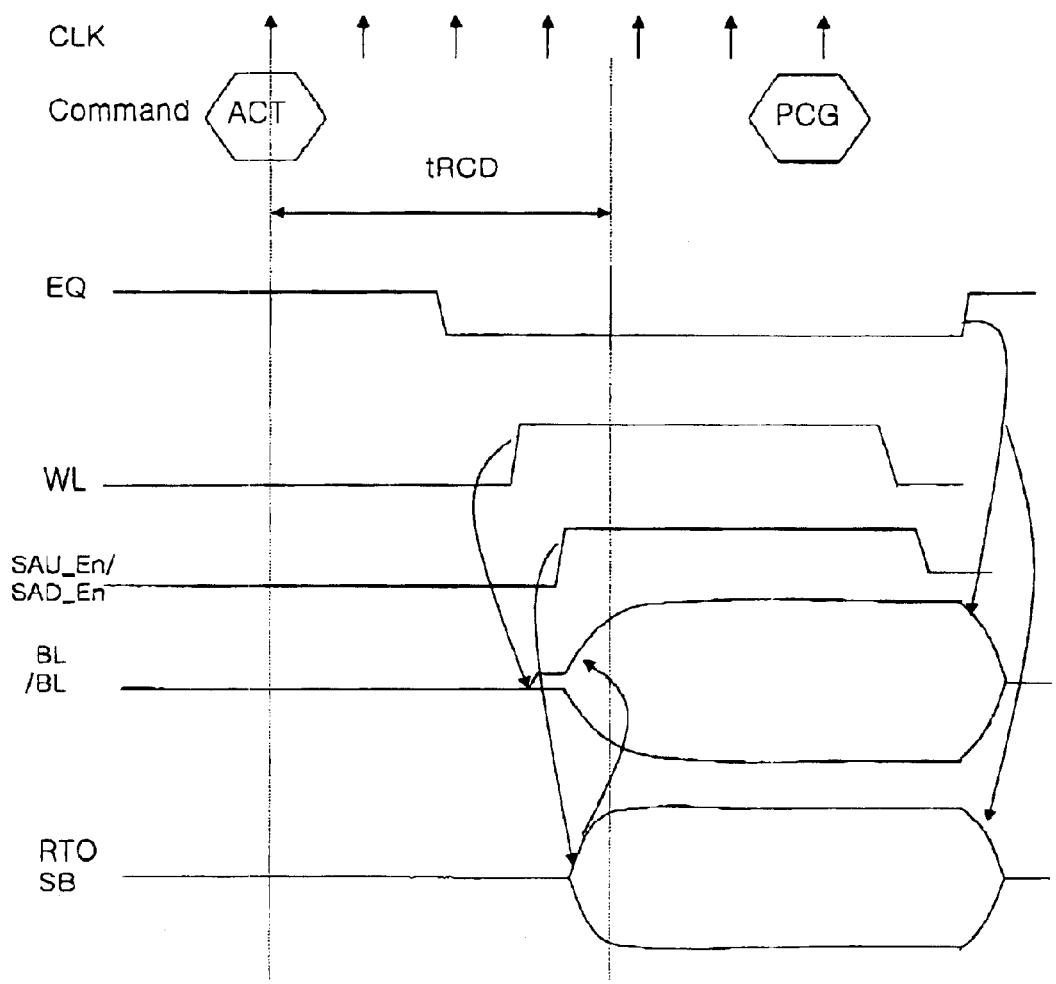
FIG. 2 is a timing diagram snowing an operation of the memory device in FIG. 1 in accordance with the present invention.

FIG. 2 is a timing diagram showing an operation of the memory device in FIG. 1 in accordance with the present invention.

As shown, an equalizing signal EQ is inactivated by generating an active command ACT. When the equalizing signal EQ is in an activation state, the equalizer 32 maintains the sense amplifier diving lines RTO and SZ of the sense amplifier array block 20 with the precharge voltage level. If the equalizing signal EQ is inactivated, the sense amplifier driving lines RTO and SZ are electrically isolated. Subsequently, a word line is activated to access the unit memory cell array block 10 selected by a row address. As the word line is activated, data of unit memory cells 12, which are in the selected unit memory call array block 10, are provided to the bit lines. At this time, a minute voltage difference between the pair of bit lines BL and /BL is caused. Thereafter, the sense amplifier pull-up enable signal SAU_En and the sense amplifier pull-down enable signal SAN_En are activated to drive the NMOS transistors 22, 34 and 36, so that the power supply voltage Vcc and the ground voltage Vss are supplied to the sense amplifier driving lines RTO and SZ of the sense amplifier array block 20 to thereby drive each sense amplifier 22 in the sense amplifier array block 20 for sensing and amplifying the voltage difference between the pair of bit line BL and /BL.

After a predetermined time, a precharge command PCG is provided, and then, the word line is activated. Also, the sense amplifier enable signals SAU_En and SAD_En are inactivated and the equalizing signal EQ inputted to the equalizer 32 is activated. A tRCD in FIG. 2 represents a time by which the amplification operation of the sense amplifier is sufficiently achieved for the bit lines after the active command ACT is applied.

In accordance with the present invention, as the plurality of NMOS transistors 24 are disposed in the sense amplifier array block 20 for supplying the power supply voltage Vcc to the sense amplifier driving line RTO in the sense amplifier array block 20, an access time of the memory cell can be reduced because a power is sufficiently supplied in driving the sense amplifier by reducing a resistance of the power supply line between the power supply line and the sense amplifier. If a sufficient power can be supplied to each sense amplifier, an amplification operation for the voltage difference between the bit lines BL and /BL can be quickly carried out. Namely, it means that an operation speed of the sense amplifier 22 is improved. Also, the above arrangement improves an operation speed of the sense amplifier 22 by compensating a driving speed of a PMOS latch in the sense amplifier 22, which is lower than that of an NMOS latch in the sense amplifier 22. Accordingly, the data access time in the memory, cell can be reduced.

Figure 3:
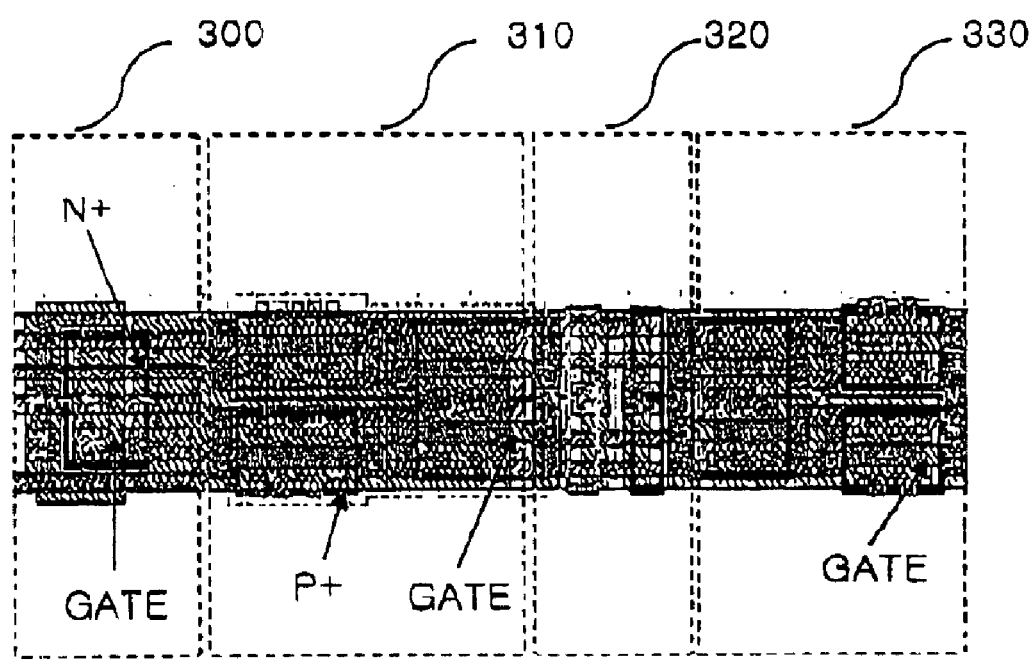
FIG. 3 is a micrograph showing a layout of the bit line sense amplifier array block in the memory device in accordance with the present invention.

FIG. 3 is a micrograph showing a layout of the bit line sense amplifier array block in the memory device in accordance with the present invention.

As shown, the bit line sense amplifier array block includes the NMOS transistor 300, a PMOS transistor 310 in a sense amplifier latch, a well bias 320 and an NMOS transistor 330 in the sense amplifier latch. A gate extension direction of the PMOS transistor 300 and the NMOS transistor 330 configuring the sense amplifier is a horizontal direction, and a gate extension direction of the NMOS transistor 300 is a vertical direction. Namely, the gate extension direction of the NMOS transistor 300 is substantially perpendicular to that of other transistors 310 and 330.

FIGS. 4A to 4F are schematic diagram illustrating the memory devices having various arrangements of the sense amplifier array block, the unit memory cell array block and the sense amplifier drivers. The sense amplifier driver is to provide a power to sense amplifier driving lines in response a control signal and MOS transistors are employed as the sense amplifier. Hereinafter, a symbol, 'O' represents a PMOS transistor and a symbol, "●" represents an NMOS transistor. Herein, a size of each symbol represents a relative size of each transistor.

Figure 4A:
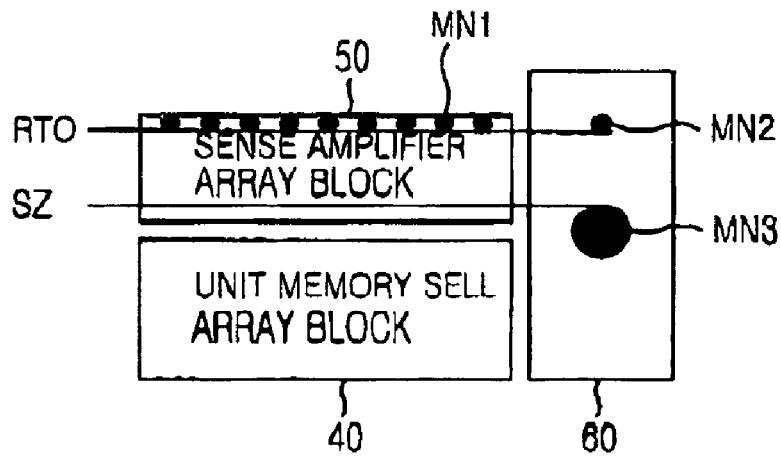
FIG. 4A is a schematic diagram illustrating the memory device in accordance with the preferred embodiment of the present invention.

FIG. 4A is a, schematic diagram illustrating the memory device in accordance with the preferred embodiment of the present invention.

As shown, the memory device is divided into a unit memory cell array block 40, a sense amplifier array block 50 and a hole area 60. In order to perform a pull-up operation of the sense amplifier driving line RTO, a plurality of NMOS transistors MN1 are disposed in the sense amplifier array block 50 and a single NMOS transistor MN2 is disposed in the hole area 60. A size of an NMOS transistor MN3, which is disposed in the hole area 60, for performing a pull-down operation of the sense amplifier driving line SZ, is designed to have a sufficient drivability against a resistance of the sense amplifier driving line SZ. The NMOS transistors MN and the NMOS transistor MN2 are designed to relatively have smaller size than that of the NMOS transistor MN3. The NMOS transistor MN2 disposed in the hole area 32 can be removed in a state of which the plurality of NMOS transistors MN1 are disposed in the sense amplifier array block 50. Since the NMOS transistor MN2 relatively has small size, it has a week effect for driving the sense amplifier rather than the NMOS transistor MN3.

Figure 4B:
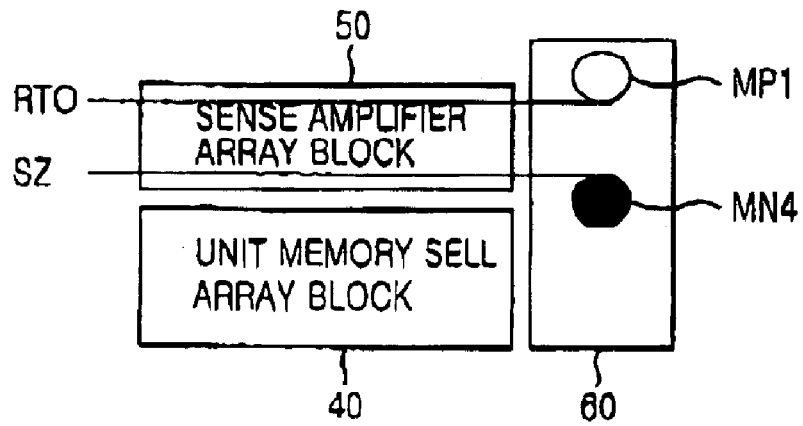
FIG. 4B is a schematic diagram showing a typical memory device.

FIG. 4B is a schematic diagram showing a typical memory device.

As shown, a single PMOS transistor MP1 for performing a pull-up operation of the sense amplifier driving line RTO and the single NMOS transistor MN4 for performing a pull-down operation of the sense amplifier driving line SZ are disposed in the hole area 60. The PMOS transistor MP1 and the NMOS transistor MN4 are configured to relatively have a large size enough for driving the sense amplifier driving lines RTO and SZ against the resistances of each sense amplifier driving lines RTO and SZ.

Figure 4C:
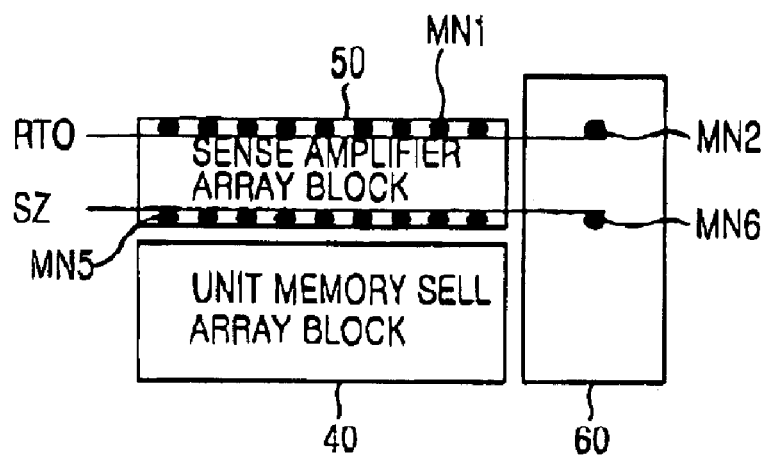
FIG. 4C is a schematic diagram showing another memory device in accordance with another, embodiment of the present invention.

FIG. 4C is a schematic diagram showing another memory device in accordance with another embodiment of the present invention.

As shown, in order to perform a pull-up operation of the sense amplifier driving line RTO, a plurality of NMOS transistors MN1 are disposed in the sense amplifier array block 50 and an NMOS transistor MN2 is disposed in the hole area 60. A plurality of NMOS transistors MN5 are disposed in the sense amplifier array block 50 and a single NMOS transistor MN6 is disposed in the hole area 60 for performing a pull-down operation of the sense amplifier driving line SZ.

Figure 4D:
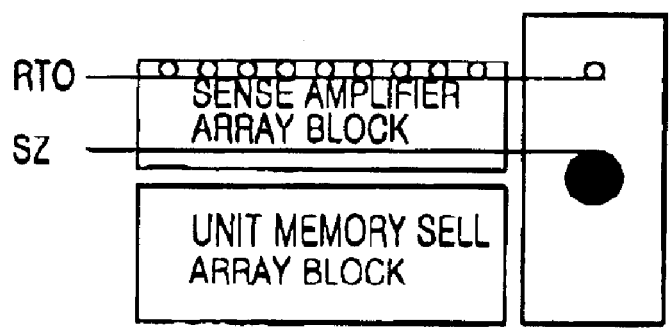
FIGS. 4D to 4F are schematic diagrams illustrating memory devices to be compared with the memory device of the present invention.
Figure 4E:
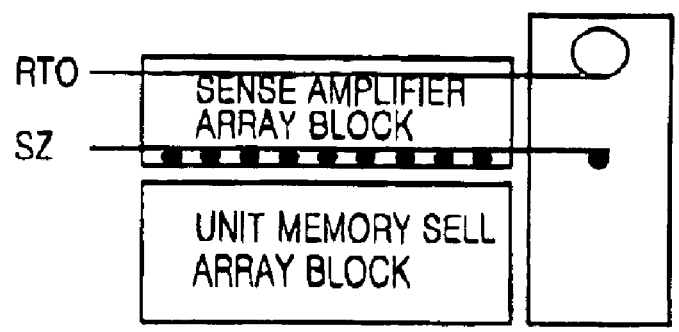
Figure 4F:
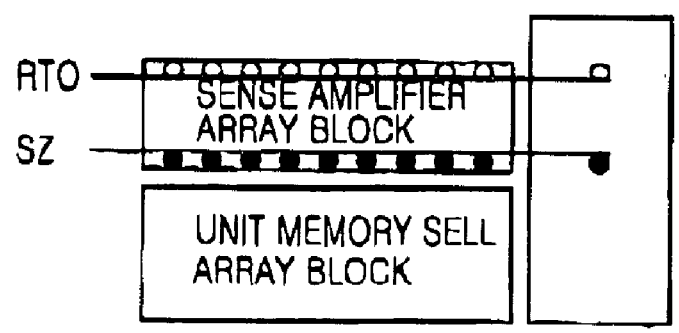

FIGS. 4D to 4F are schematic diagrams illustrating memory devices capable of being compared with the memory device of the present invention. The memory devices are preferable for the area, but there is a problem that a data access time is decreased.

Figure 5A:
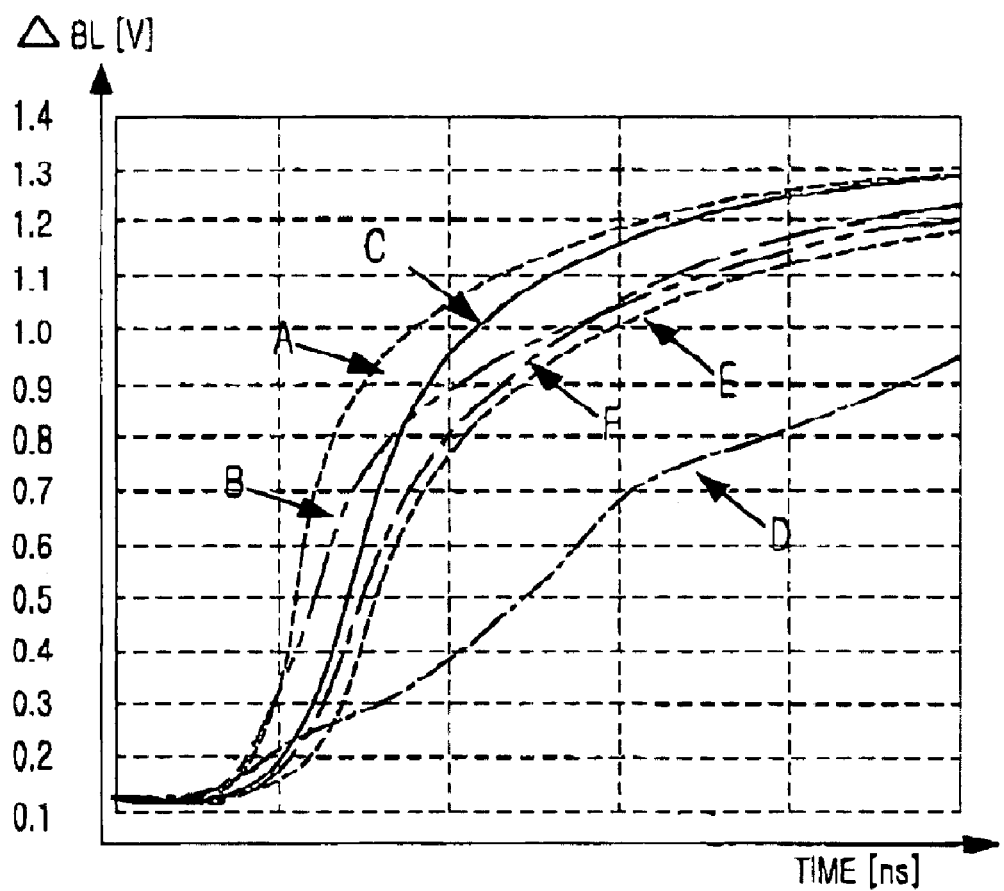
FIGS. 5A and 5B are graphs illustrating simulation results comparing an operation speed of sense amplifier for each memory device illustrated in FIGS. 4A to 4F.
Figure 5B:
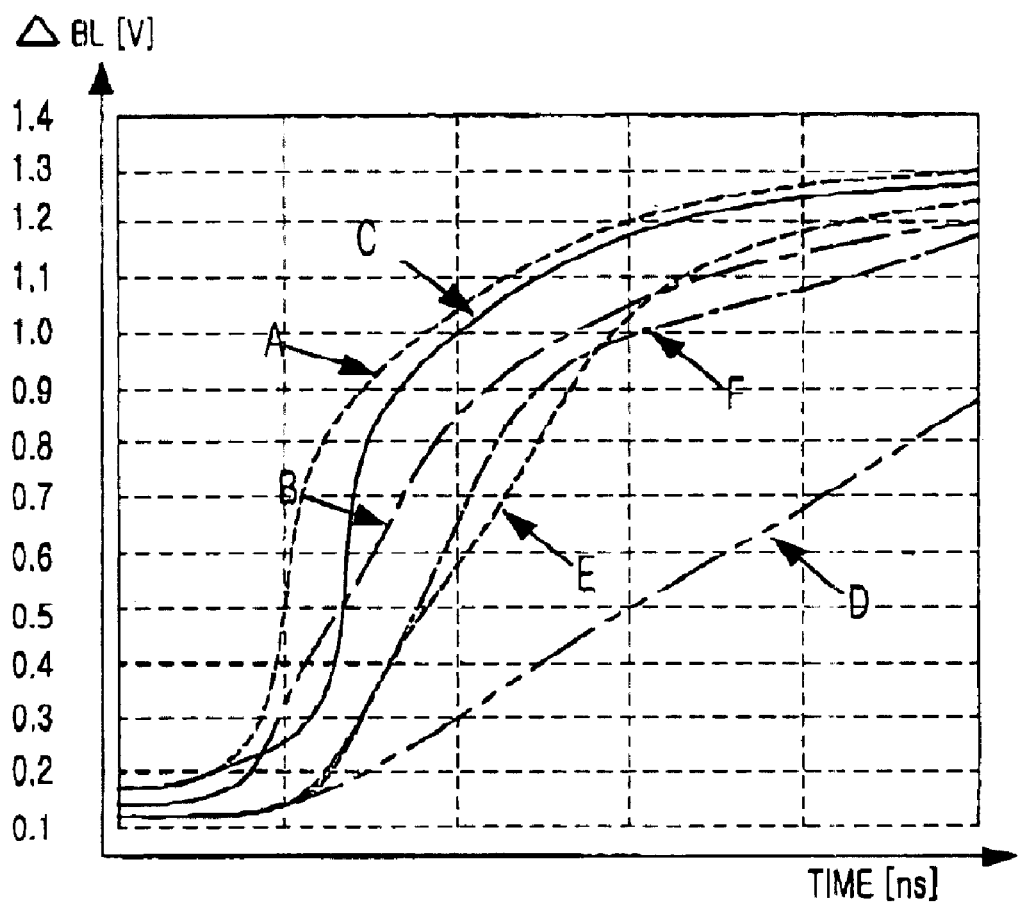

FIGS. 5A and 5B are graphs illustrating simulation results comparing an operation speed of sense amplifier for each memory device illustrated in FIGS. 4A to 4F.

Specially, FIG. 5A is a graph showing simulation results for the data corresponding to a logic high level stored in the memory cell, and FIG. 5B is a graph showing simulation results for the data corresponding to a logic low level stored in the memory cell.

Referring to FIGS. 5A and 5B, each graph, 'A', 'B', 'C', 'D', 'E' and 'F' shows the simulation results of amplification operations for each sense amplifier in FIGS. 4A to 4F, respectively. Y axis represents variation of voltage difference between the bit lines BL and /BL. A unit and a scale of the Y axis are voltage and 0.1 V, respectively. X axis represents time, and a unit and a scale of the x axis corresponds to nano second (ns) and 1 ns, respectively.

The graph, 'A' shows that the amplification operation for the voltage difference between the bit lines BL and /BL is most quickly and largely carried out for every time. Namely, the operation of the sense amplifier in FIG. 4A in accordance with the present invention is the fastest among sense amplifiers in FIGS. 4A to 4F.

The graph, 'C', shows that the amplification operation is slower than that of the graph, 'B' in an early time. However, in a late time, the amplification operation is faster than that of the graph, 'B'. A turning point which the amplification operation of the graph, 'C' becomes faster than that of the graph, 'B', is determined by an input time of a column address strobe (CAS) signal.

The graphs, 'D'0 to 'F' show that the amplification operation in slower than that of the graph, 'B' at every time.

As mentioned the above, FIG. 5B is a graph showing simulation results for the data corresponding to a logic low level stored in the memory cell. The graph, 'A' shows that the amplification operation for the voltage difference between the bit lines BL and /BL is most quickly and largely carried out for every time.

Accordingly, the memory device in accordance with the present invention achieves a rapid data access time regardless of a logic level of data stored in the memory cell.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having sense amplifier array blocks between neighboring unit memory cell array blocks in a column direction, the semiconductor memory device comprising:

a first sense amplifier driving line configured by passing the sense amplifiers in a row direction;

a second sense amplifier driving line configured by passing the sense amplifiers in a row direction;

a plurality of first NMOS transistors, which are disposed in the sense amplifier array block, for locally performing a pull-up operation of the first sense amplifier driving line in response to a first control signal; and a second NMOS transistor, which is disposed in a hole area, for performing a pull-down operation of the second sense amplifier driving line in response to a second control signal.

2. The semiconductor memory device as recited in claim 1, wherein the second NMOS transistor has a relatively large size to have a drivability to perform the pull-down operation of the second sense amplifier driving line against a resistance of the second amplifier driving line, and a size of the first NMOS transistor is smaller than that of the second NMOS transistor.

3. The semiconductor memory device as recited in claim 2, further comprising a third NMOS transistor, which is disposed in the hole area, for performing the pull-up operation of the first sense amplifier driving line in the response to the first control signal.

4. The semiconductor memory device as recited in claim 3, wherein the third NMOS transistor has a smaller size than the second NMOS transistor.

5. The semiconductor memory device as recited in claim 1, wherein each first NMOS transistor is disposed for a set of two sense amplifiers in the sense amplifier array block.

6. The semiconductor memory device as recited in claim 1, wherein a gate extension direction of transistors configuring the sense amplifiers is substantially perpendicular to a gate extension direction of the first NMOS transistors.

7. A semiconductor memory device having sense amplifier array blocks between neighboring unit memory cell array blocks in a column direction, the semiconductor memory device comprising:

a first sense amplifier driving line configured by passing the sense amplifiers in a row direction;

a second sense amplifier driving line configured by passing the sense amplifiers in a row direction;

a plurality of first NMOS transistors, which is disposed in the sense amplifier array block, for locally performing a pull-up operation of the first sense amplifier driving line in response to a first control signal; and a plurality of second NMOS transistors, which is disposed in the sense amplifier array block, for locally performing a pull-down operation of the second sense amplifier driving line in response to a second control signal.

8. The semiconductor memory device as recited in claim 7, further comprising a third NMOS transistor, which is disposed in the hole area, for performing the pull-up operation of the first sense amplifier driving line in the response to the first control signal.

9. The semiconductor memory device as recited in claim 8, further comprising a fourth NMOS transistor, which is disposed in the hole area, for performing the pull-down operation of the second sense amplifier driving line in the response to the second control signal.

10. The semiconductor memory device as recited in claim 9, wherein the third and fourth NMOS transistor have a smaller size than the first and second NMOS transistor, respectively.

11. The semiconductor memory device as recited in claim 9, wherein one first NMOS transistor and one second NMOS transistor are disposed for a set of two sense amplifier in the sense amplifier array block.

12. The semiconductor memory device as recited in claim 7, wherein a gate extension direction of transistors configuring the sense amplifiers is substantially perpendicular to a gate extension direction of the first and second NMOS transistors.

* * * * *